(12) United States Patent
Mackh et al.

(10) Patent No.: US 10,748,801 B2
(45) Date of Patent: Aug. 18, 2020

(54) CARRIER ARRANGEMENT AND METHOD FOR PROCESSING A CARRIER BY GENERATING A CRACK STRUCTURE

(71) Applicant: Infineon Technologies AG, Neubiberg (DE)

(72) Inventors: Gunther Mackh, Neumarkt (DE); Markus Brunnbauer, Lappersdorf (DE); Adolf Koller, Regensburg (DE); Jochen Mueller, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/939,921

(22) Filed: Mar. 29, 2018

(65) Prior Publication Data
US 2018/0286735 A1  Oct. 4, 2018

(30) Foreign Application Priority Data
Mar. 30, 2017  (DE) .................. 10 2017 106 854

(51) Int. Cl.
*H01L 21/683* (2006.01)
*H01L 29/36* (2006.01)
*H01L 21/268* (2006.01)
*H01L 21/78* (2006.01)

(52) U.S. Cl.
CPC ........ *H01L 21/6835* (2013.01); *H01L 21/268* (2013.01); *H01L 21/6836* (2013.01); *H01L 29/36* (2013.01); *H01L 21/78* (2013.01); *H01L 2221/6834* (2013.01); *H01L 2221/68327* (2013.01); *H01L 2221/68336* (2013.01); *H01L 2221/68381* (2013.01)

(58) Field of Classification Search
CPC .............. H01L 21/6835; H01L 21/268; H01L 21/6836; H01L 21/78; H01L 29/36; H01L 2221/6834; H01L 2221/68327; H01L 2221/68336; H01L 2221/68381
See application file for complete search history.

(56) References Cited

U.S. PATENT DOCUMENTS

| | | | | |
|---|---|---|---|---|
| 2002/0060353 A1* | 5/2002 | Matsuoka | ............... | H01L 29/36 257/592 |
| 2010/0012632 A1* | 1/2010 | Sakamoto | .............. | B23K 26/12 219/121.72 |
| 2012/0100694 A1* | 4/2012 | Kajiyama | ............... | H01L 21/78 438/462 |
| 2015/0279740 A1 | 10/2015 | Roesner et al. | | |

FOREIGN PATENT DOCUMENTS

CN          106409762 A       2/2017

* cited by examiner

*Primary Examiner* — Laura M Menz
*Assistant Examiner* — Candice Chan
(74) *Attorney, Agent, or Firm* — Slater Matsil, LLP

(57) ABSTRACT

According to various embodiments, a method for processing a carrier may include: forming an arrangement of defects in the carrier, wherein a surface region of the carrier is disposed over the arrangement of defects at a first surface of the carrier, wherein the arrangement of defects is configured to generate a crack structure extending from the arrangement of defects into the surface region; partially removing the carrier to remove the arrangement of defects; and separating the surface region of the carrier into a plurality of surface region portions along the crack structure.

13 Claims, 8 Drawing Sheets

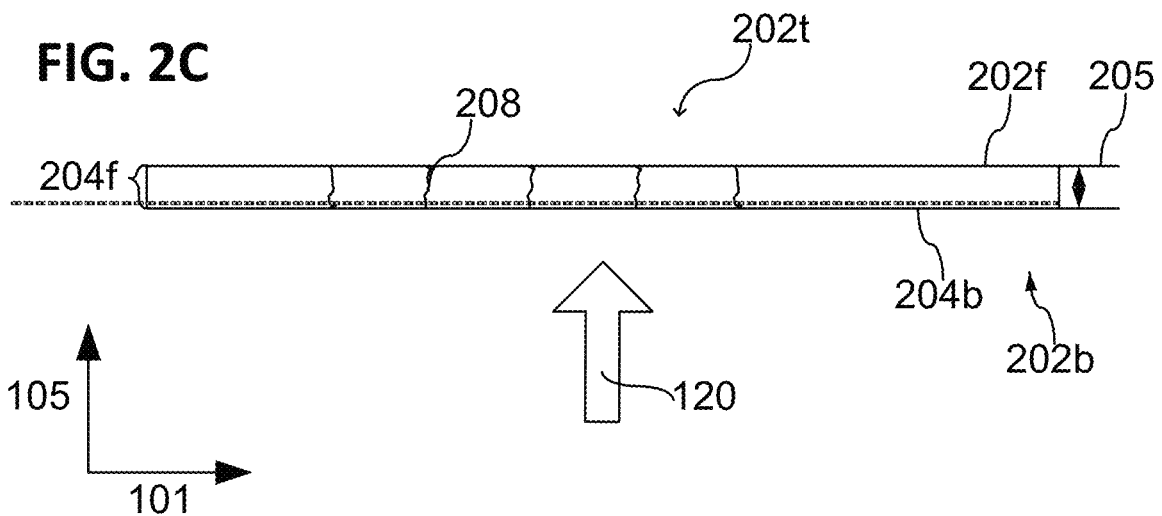
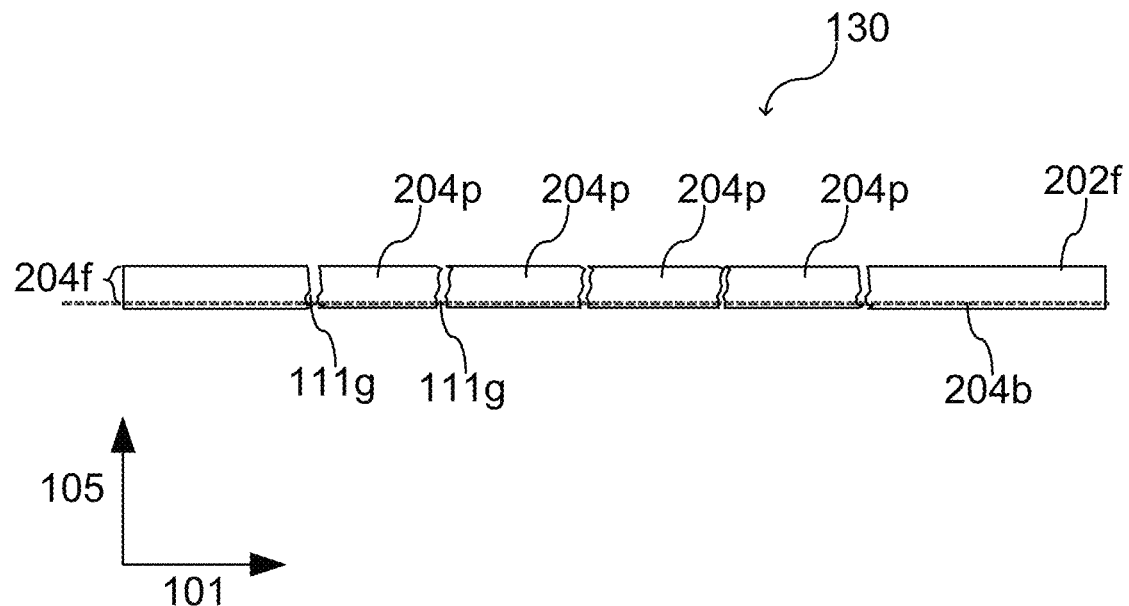

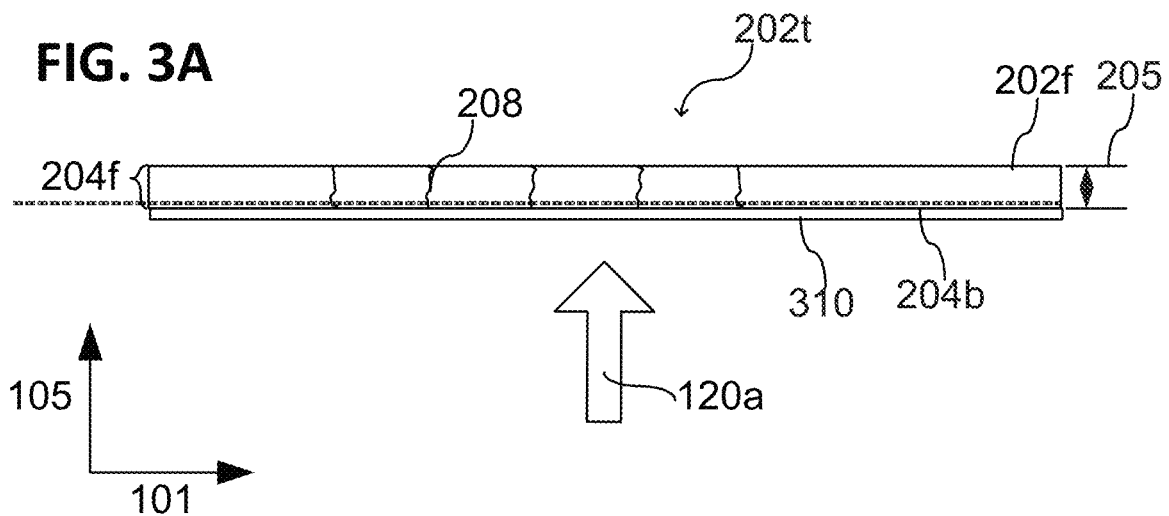
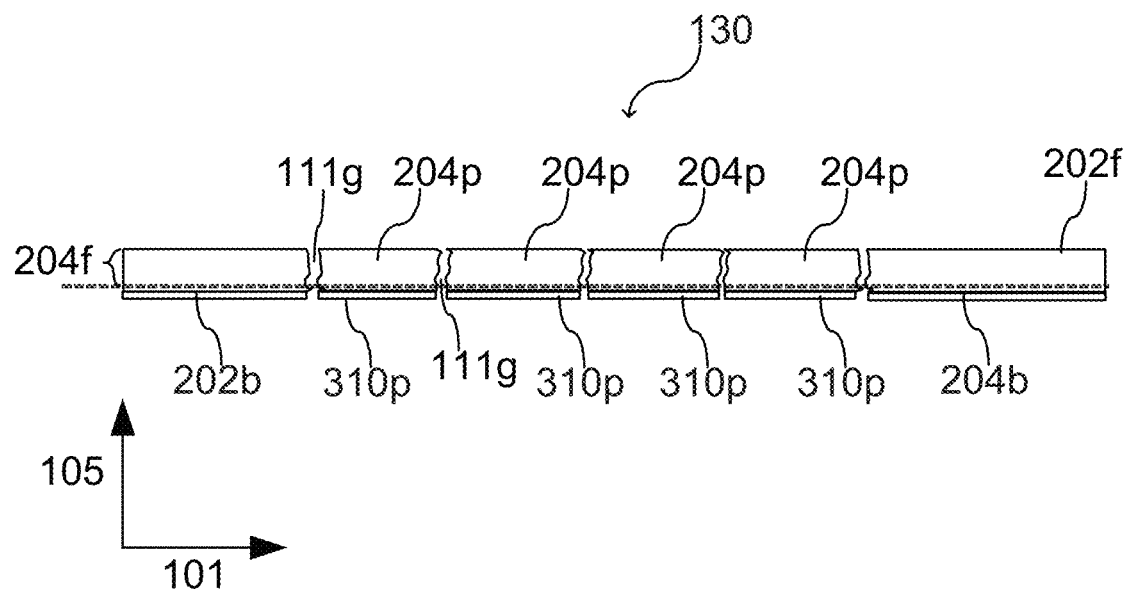

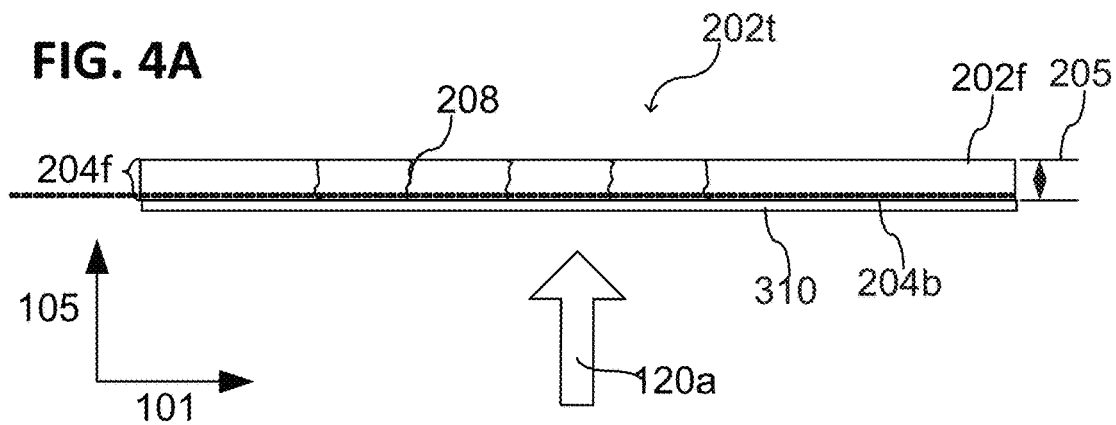
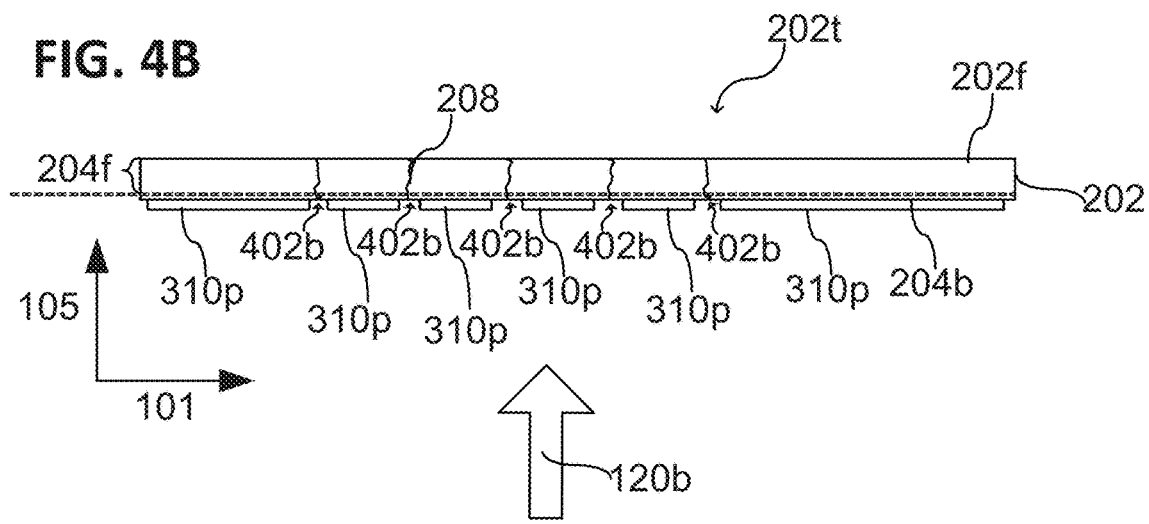
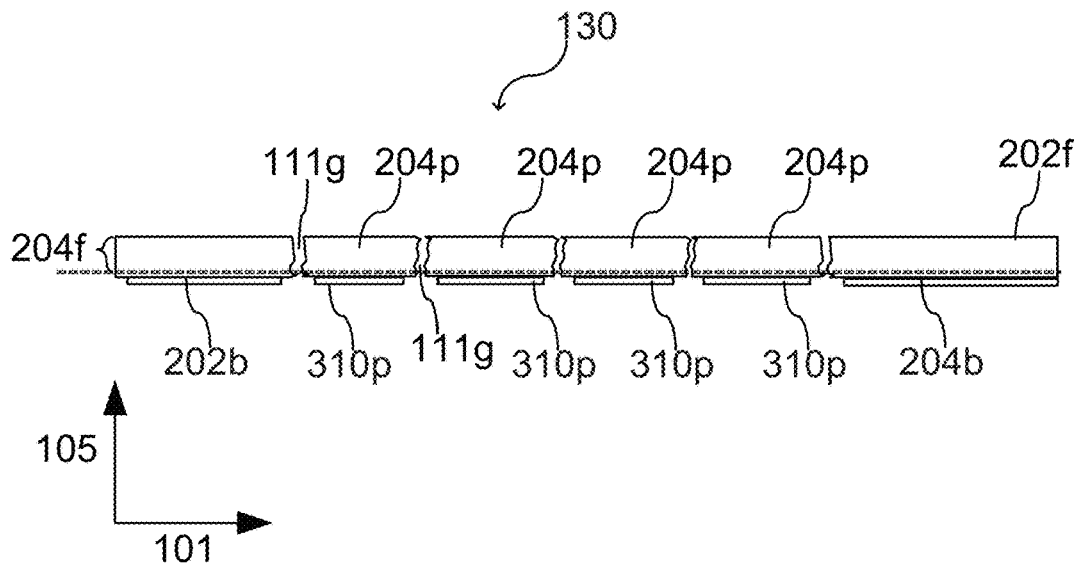

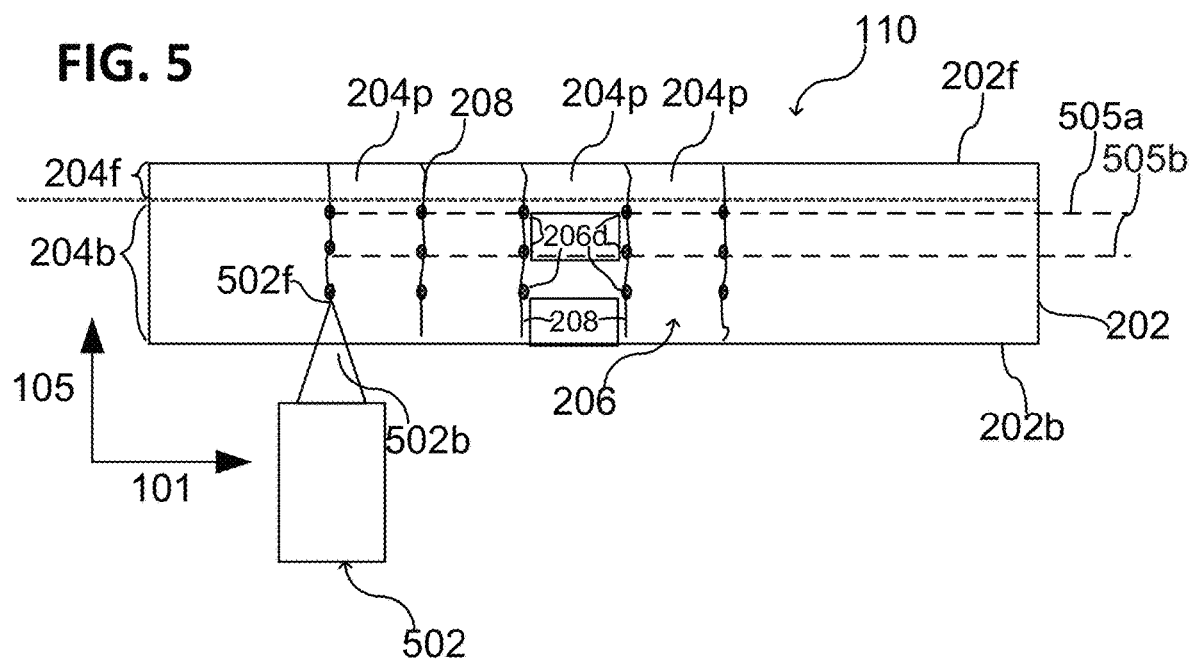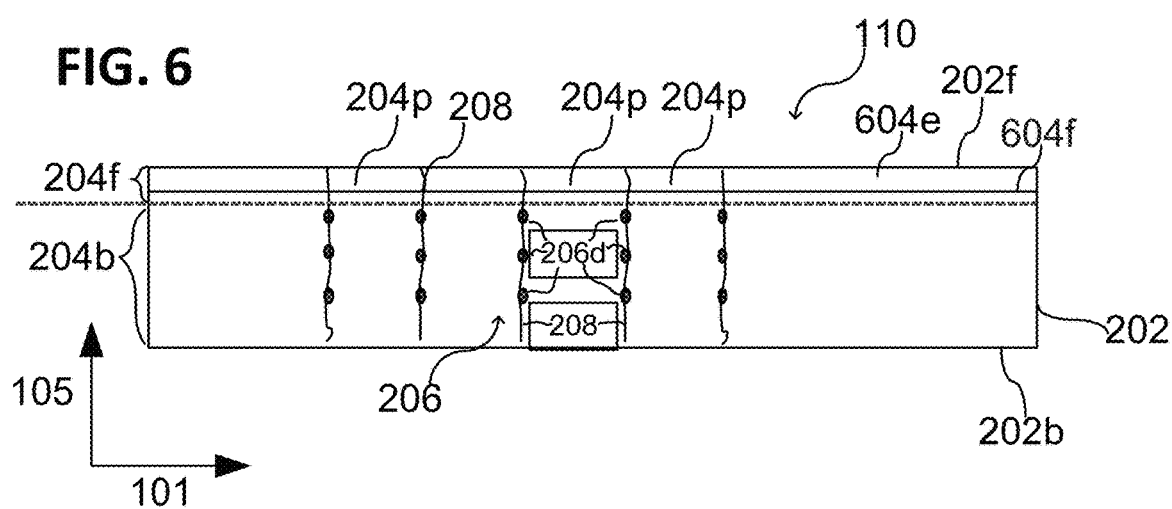

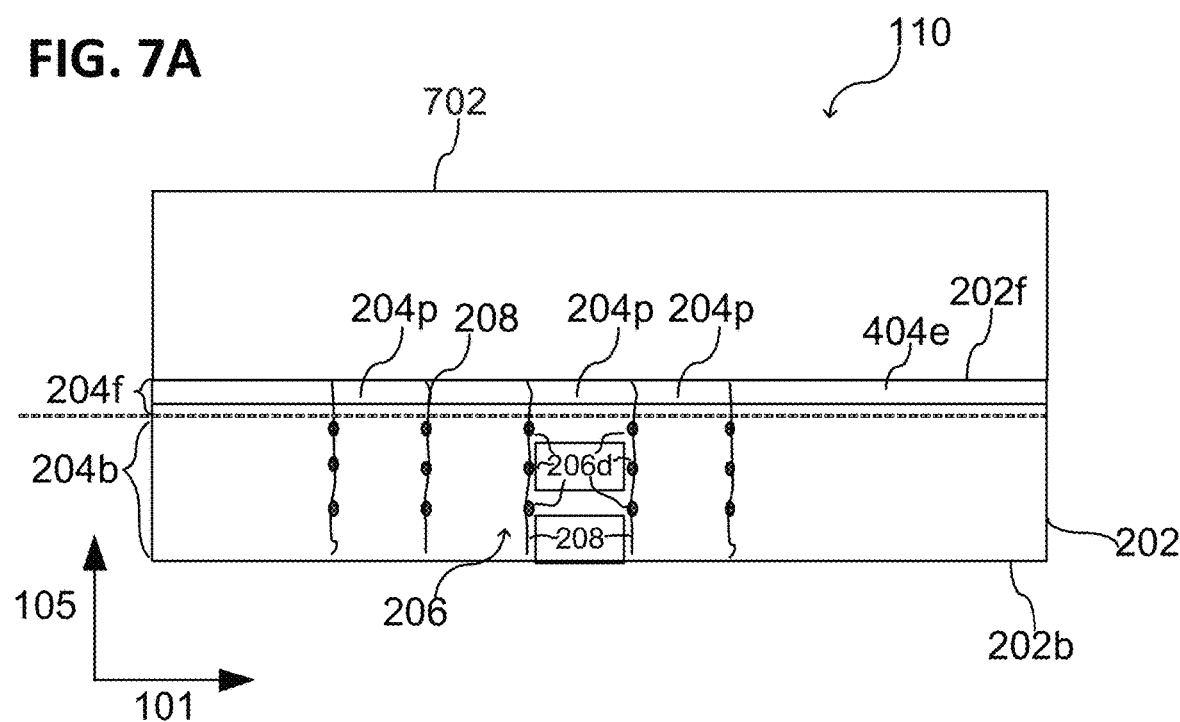
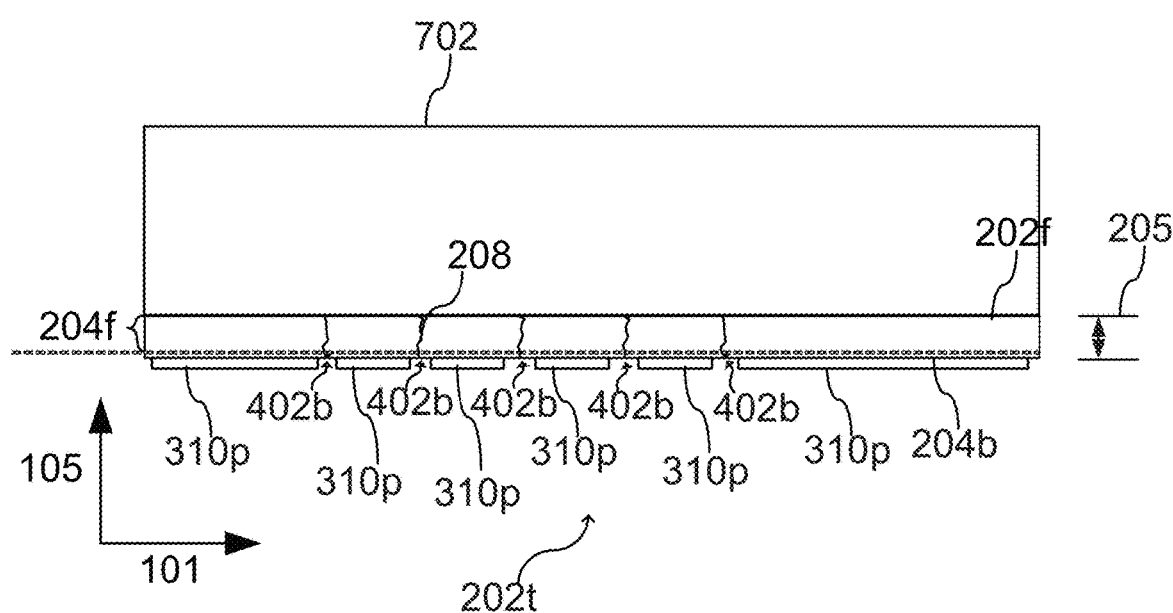

CARRIER ARRANGEMENT AND METHOD FOR PROCESSING A CARRIER BY GENERATING A CRACK STRUCTURE

This application claims the benefit of German Application No. 102017106854.6, filed on Mar. 30, 2017, which application is hereby incorporated herein by reference in its entirety.

TECHNICAL FIELD

Various embodiments relate generally to a carrier, a carrier arrangement and a method for processing a carrier.

BACKGROUND

In general, various techniques may be used for processing a wafer or any other carrier. Processing the wafer may include singulating the wafer into a plurality of dies. The singulated dies may be also referred to as chips, bare chips, or bare dies and the process of singulating the dies from the wafer may be also referred to as dicing or chipping. For separating a wafer into a plurality of dies various techniques may be used, as for example, mechanical dicing, laser ablation dicing, dicing by grinding, plasma dicing, and the like. During processing a wafer on wafer-level, i.e. before singulating the wafer into a plurality of dies, so called kerf regions may be provided that surround active die regions of the wafer accordingly. Therefore, a material loss due the dicing process performed at a later stage may be already considered during processing the wafer. After singulating the wafer into a plurality of dies, a packaging process may be used for housing the dies. The dies may be packed individually or more than one die may be provided in a so-called multi-chip package. However, there may be processes including a packaging process or a part of a packaging process on wafer-level.

SUMMARY

According to various embodiments, a method for processing a carrier may include: forming an arrangement of defects in the carrier, wherein a surface region of the carrier is disposed over the arrangement of defects at a first surface of the carrier, wherein the arrangement of defects is configured to generate a crack structure extending from the arrangement of defects into the surface region; partially removing the carrier to remove the arrangement of defects; and separating the surface region of the carrier into a plurality of surface region portions along the crack structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2C shows a surface region of a carrier in a schematic cross-sectional view at a second stage during processing the carrier, according to various embodiments;

FIG. 2D shows separated surface region portions of a carrier in a schematic cross-sectional view at a third stage during processing the carrier, according to various embodiments;

FIGS. 3A and 3B show a surface region of a carrier in a schematic cross-sectional view at various stages during processing the carrier, according to various embodiments;

FIGS. 4A to 4C show a surface region of a carrier in a schematic cross-sectional view at various stages during processing the carrier, according to various embodiments;

FIG. 5 shows a carrier in a schematic cross-sectional view at a first stage during processing the carrier, according to various embodiments;

FIG. 6 shows a carrier in a schematic cross-sectional view at a first stage during processing the carrier, according to various embodiments;

FIGS. 7A and 7B show a carrier in a schematic cross-sectional view at various stages during processing the carrier, according to various embodiments;

DETAILED DESCRIPTION OF ILLUSTRATIVE EMBODIMENTS

Figure 1:
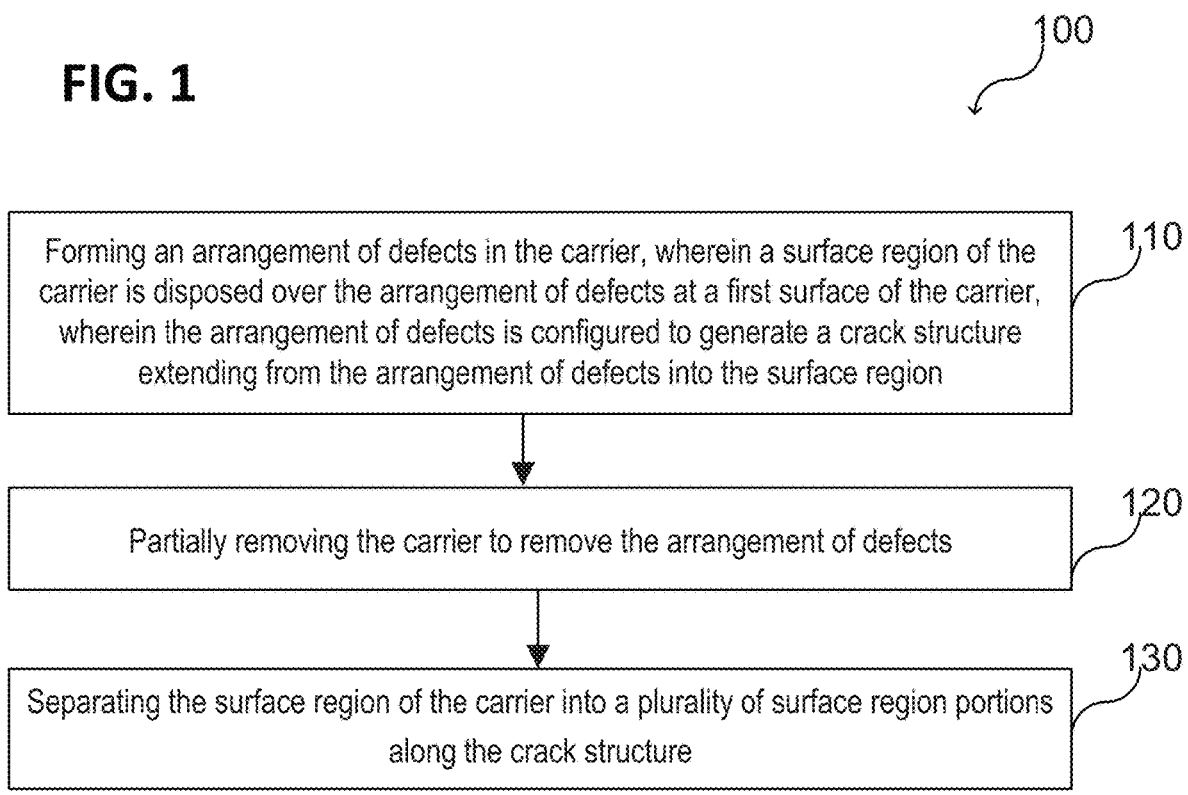
FIG. 1 shows a schematic flow diagram of a method for processing a carrier, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The word "over", used herein to describe forming a feature, e.g. a region "over" a side or surface, may be used to mean that the feature, e.g. the region, may be formed "directly on", e.g. in direct contact with, the implied side or surface. The word "over", used herein to describe forming a feature, e.g. a region "over" a side or surface, may be used to mean that the feature, e.g. the region, may be formed "indirectly on" the implied side or surface with one or more additional regions being arranged between the implied side or surface and the formed region.

In like manner, the word "cover", used herein to describe a feature disposed over another, e.g. a region "covering" a side or surface, may be used to mean that the feature, e.g. the region, may be disposed over, and in direct contact with, the implied side or surface. The word "cover", used herein to describe a feature disposed over another, e.g. a region "covering" a side or surface, may be used to mean that the feature, e.g. the region, may be disposed over, and in indirect contact with, the implied side or surface with one or more additional regions being arranged between the implied side or surface and the covering region.

The term "lateral" used with regards to the "lateral" extension of a structure (or of a structure element) provided on or in a carrier (e.g. a region, a substrate, a wafer, or a semiconductor work piece) or "laterally" next to, may be used herein to mean an extension or a positional relationship along a surface of the carrier. That means that a surface of a carrier (e.g. a surface of a substrate, a surface of a wafer, or a surface of a work piece) may serve as reference, commonly referred to as the main processing surface. Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier). The term "thickness" used with regards to a "thickness" of a region may be used herein to mean the spatial extension of the region perpendicular to the surface of the support (the material or material structure) on which the region is deposited. If a surface of the support is parallel to the surface of the carrier (e.g. parallel to the main processing surface) the "thickness" of the region deposited on the surface of the support may be the same as the height of the region.

The term region used with regards to a "doped region", "surface region", "support region", "body region", and the like, may be used herein to mean a continuous region.

According to various embodiments, a semiconductor region (e.g. a semiconductor substrate, a semiconductor wafer, a deposited semiconductor region, an epitaxial semiconductor region, and the like) may be made of or may include silicon. However, other semiconductor materials of various types may be used in a similar way, e.g. germanium, Group III to V (e.g. SiC), or other types, including for example polymers. In an embodiment, the semiconductor region is a wafer made of silicon (e.g. p-type doped or n-type doped). In an alternative embodiment, the semiconductor region is a silicon on insulator (SOI) wafer.

According to various embodiments, a method for processing ultra-thin dies (or ultra-thin chips) is provided herein. The dies may have a thickness of less than about 50 µm. The dies may optionally include a backside metal. Further, the dies may optionally include a highly doped surface layer (e.g. a highly doped epitaxial layer) at the front side.

The processing, according to various embodiments, may provide a cost efficient dicing concept for such ultra-thin dies. Further, the dicing concept described herein allows patterning a backside metallization on a planar surface on wafer-level. Illustratively, the dicing concept described herein allows forming a backside metallization on before separating the dies from the wafer. According to various embodiments, a backside metallization may include one or more electrically conductive layers (e.g. metal layers). The one or more metal layers of the backside metallization may be based on copper or a copper alloy, aluminum or an aluminum allow, or any other suitable electrically conductive material. The backside metallization may also include a thick metal layer, e.g. having a thickness greater than about 2 µm, e.g. greater than about 5 µm. In this case, the backside metallization may be configured to also mechanically stabilize the ultra-thin die.

According to various embodiments, the dies may also include a front side metallization. According to various embodiments, a front side metallization may include one or more metal layers as desired for contacting the respective electronic structures of the die. The front side metallization may also include thick metal layer, e.g. having a thickness greater than about 5 µm, e.g. based on copper or a copper alloy, aluminum or an aluminum allow, or any other suitable electrically conductive material. In this case, the front side metallization may be configured to also mechanically stabilize the ultra-thin die.

According to various embodiments, an ultra-thin die, as described herein, may be used for manufacturing a vertical device, e.g. vertical power device, as for example vertical diode, vertical transistor, and/or vertical thyristor. A vertical device may be configured to substantially provide a current flow vertically through the die, e.g. from a front side of the die to a backside of the die. Further, the lateral edges of the die may be configured to avoid an electrical shortcut between the front side and the backside.

According to various embodiments, a stealth dicing process may be used for singulating a plurality of carrier portions from a carrier, e.g. for singulating a plurality of dies from a wafer. During the stealth dicing process, the carrier (e.g. a wafer) may be supported by a glass carrier or any other suitable auxiliary carrier. Further, a backside metal patterning process may be carried out before and/or during singulating the carrier.

In general, competing conventionally used dicing concepts may have one or more disadvantages regarding singulation of ultra-thin dies. During mechanical dicing, a sidewall of the dies may be damaged by the dicing blades. A laser ablation process may reduce the die strength and may cause metal contamination of a sidewall of the dies. Standard dicing by grinding (DBG) concepts may be hardly compatible with process flows including dies having a backside metallization. Plasma dicing concepts may include a complicate process flow to avoid backside metal covering the die sidewalls and topological steps on the backside may make a backside patterning more difficult.

According to various embodiments, an efficient dicing concept may be provided avoiding a metal contamination of the respective sidewalls of the die.

FIG. 1 illustrates a schematic process flow of a method 100 for processing a carrier. The method includes: in 110, forming an arrangement of defects in the carrier configured to generate a crack structure extending from the arrangement of defects into a surface region of the carrier; in 120, partially removing the carrier to remove the arrangement of defects; and, in 130, separating the surface region of the carrier into a plurality of surface region portions along the crack structure. The surface region of the carrier is disposed over the arrangement of defects at a first surface of the carrier. Without loss of generality, the first surface may be a front side surface at a front side of the carrier, e.g. a so-called main processing surface of the carrier. According to various embodiments, partially removing the carrier may include exposing a second surface of the surface region opposite the first surface. The method 100 may further include forming a metallization structure on the exposed second surface of the surface region. The method 100 may further include adhering the carrier to an auxiliary carrier, wherein the surface region of the carrier faces the auxiliary carrier and wherein a backside of the carrier is exposed.

FIGS. 2A to 2D show a carrier in a schematic cross-sectional view at various stages during processing, e.g. during method 100 is carried out, according to various embodiments.

Figure 2A:
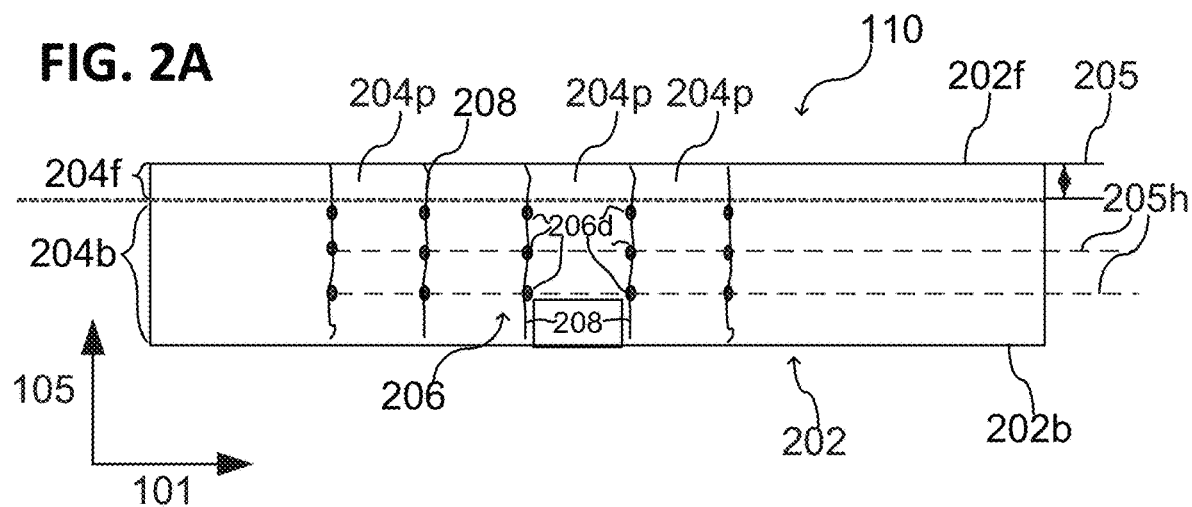
FIG. 2A shows a carrier in a schematic cross-sectional view at a first stage during processing the carrier, according to various embodiments.

FIG. 2A shows the carrier in a schematic cross-sectional view at a first processing stage, e.g. after process no of method 100 is carried out, according to various embodiments. The carrier 202 may include or may consist of a semiconductor material, e.g. silicon or any other suitable semiconductor material, e.g. silicon carbide, germanium, GaAs, and the like. The carrier 202 may be a wafer, e.g. having a diameter or width (e.g. an extension into the lateral direction 101 and/or 103 illustrated in the figures) in the range from about 10 cm to about 50 cm, or even greater than 50 cm.

The carrier 202 includes an arrangement of defects 206. Illustratively an arrangement of defective portions of the carrier 202 may be generated in the carrier 202. The arrangement of defects 206 may be formed in a body region 204b (also referred to as support region) of the carrier 202. The body region may be disposed below a surface region 204f of the carrier 202. The surface region 204f may include a first surface 202f at a first side of the carrier 202. According to various embodiments, the first surface 202f may be a main processing surface of the carrier 202 at a front side of the carrier 202. The carrier 202 may include a second surface 202b at a second side of the carrier 202 opposite the first side. According to various embodiments, the second surface 202b may be a backside surface of the carrier 202 at a backside of the carrier 202.

According to various embodiments, the carrier 202 may include one or more electronic structures disposed over and/or in the surface region 204f of the carrier 202. The one or more electronic structures may include one or more vertical electronic structures, as for example one or more vertical diode structures, one or more vertical transistor structures, and/or one or more vertical thyristor structures. According to various embodiments, the one or more electronic structures may be configured to substantially provide a current flow vertically through the carrier 202, e.g. from a front side 202f of the carrier 202 to a backside 202b of the carrier 202.

According to various embodiments, the surface region 204f may be an active region of the carrier 202 for manufacturing electronic devices, e.g. logic circuits, memory circuits, sensor, circuits, micromechanical or microelectromechanical structures, etc. The surface region 204f may have a thickness 205 (e.g. an extension along thickness or vertical direction 105) in the range from about several micrometers to about several tens of micrometers, e.g. in the range from about 5 µm to about 50 µm. According to various embodiments, at least the surface region 204f may include or may consist of a semiconductor material. The body region 204b may include any other suitable material, e.g. a support material. However, in the case that the carrier 202 is a semiconductor wafer, the carrier 202, e.g. the surface region 204f and the body region 204b, may substantially consist of semiconductor material.

According to various embodiments, the surface region 204f may include or may be an epitaxial layer. The epitaxial layer may include the same semiconductor material as the rest of the carrier 202 or as the body region 204b. As an example, the body region 204b of the carrier 202 may be provided by a semiconductor wafer (e.g. a silicon wafer) and the surface region 204f may be an epitaxial semiconductor layer (e.g. an epitaxial silicon layer) deposited over the semiconductor wafer.

According to various embodiments, the semiconductor material (e.g. the silicon) of the surface region 204f may be doped with at least one dopant. The surface region 204f may be p-type or n-type doped. The dopant concentration of the at least one dopant of the surface region 204f of the carrier 202 may be greater than about 1016 cm-3, e.g. greater than about 1017 cm-3, e.g. greater than about 1018 cm-3. In other words, the surface region 204f may include highly doped semiconductor material (e.g. highly doped silicon). In this case, the surface region 204f may not be sufficiently transparent for infrared-light to perform stealth dicing through the surface region 204f. The material (e.g. the semiconductor material) of the body region 204f may be selected to be sufficiently transparent for infrared-light to perform stealth dicing from the backside, e.g. through the body region 204b. Therefore, if the body region 204b includes for example silicon, the body region 204b may be undoped or lowly doped, e.g. with a dopant concentration less than about 1016 cm-3, e.g. less than about 1015 cm-3, e.g. less than about 1014 cm-3.

According to various embodiments, the arrangement of defects 206 is configured to generate a crack structure 208 extending from the arrangement of defects 206 into the surface region 204f of the carrier 202. According to various embodiments, the cracks of the crack structure 208 may extend (e.g. substantially vertically) up to the first surface 202f of the carrier 202. As illustrated in FIG. 2A, the surface region 204f may be free of the arrangement of defects 206, or in other words, the arrangement of defects 206 may be only generated in the body region 204b of the carrier 202. The body region 204b of the carrier 202 is also referred to herein as support region, since the body region 204b may be substantially removed during the processing, see for example FIG. 2C.

As illustrated for example in FIG. 2A, the arrangement of defects 206 may include a plurality of defects 206d arranged in a suitable pattern to generate the desired crack structure 208. The plurality of defects 206d may be arranged in one or more arrangement levels 205h. According to various embodiments, planar arrangement levels 205h may be arranged parallel to the first surface 202f of the carrier 202. The respectively adjacent defects 206d may be spaced apart from each other, e.g. with a spacing in the range from about 1 µm to about 100 µm, e.g. in the range from about 10 µm to about 80 µm, e.g. in the range from about 20 µm to about 60 µm.

According to various embodiments, each defect 206d of the arrangement of defects 206 may include modified (e.g. amorphized) material of the carrier 202 (e.g. of the body region 204b) surrounded by (single- or poly-) crystalline material of the carrier 202 (e.g. of the body region 204b). However, the defects 206d may be also porous regions or otherwise distorted regions of the carrier 202. The defects 206d may be formed by stealth dicing using a focus infrared laser beam. In this case, the defects 206d may be also referred to as candlesticks or modifications spots.

Figure 2B:
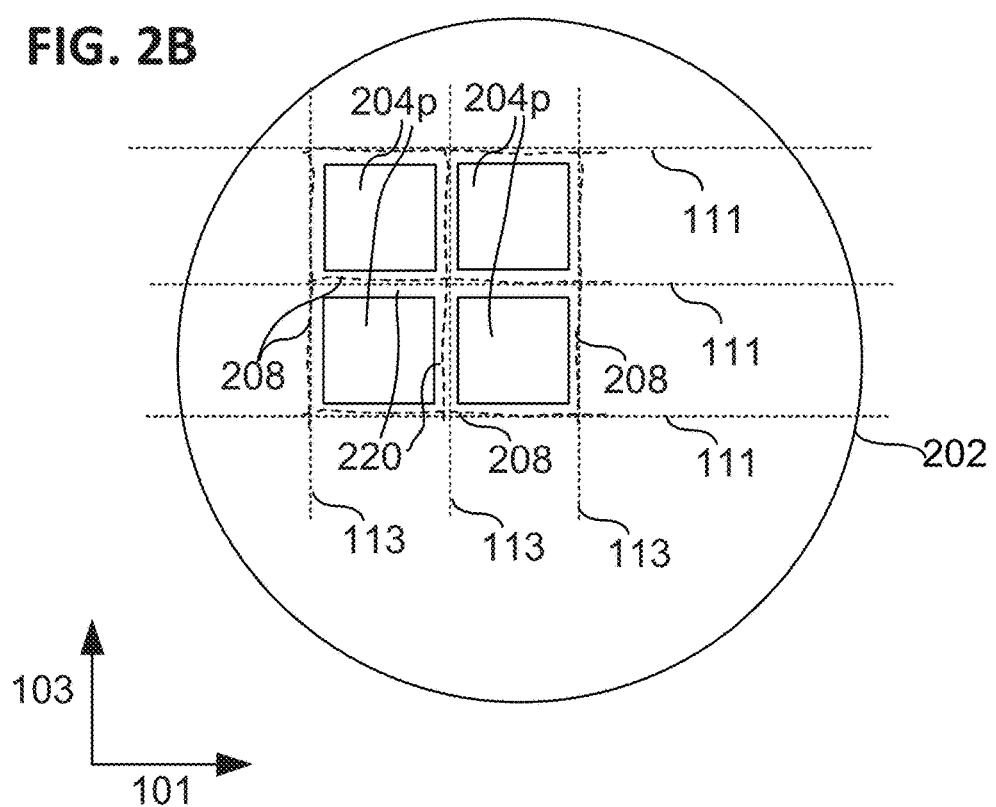
FIG. 2B shows a carrier in a schematic top view at a first stage during processing the carrier, according to various embodiments.

FIG. 2B shows the carrier 202 in a schematic top view at a first processing stage, e.g. after process no of method 100 is carried out, according to various embodiments. The carrier 202 may include a plurality of surface region portions 204p to be separated, or in other words, to be singulated or to be diced. The surface region portions 204p may be device regions of the carrier 202. The respectively adjacent surface region portions 204p to be separated from each other may be spaced apart from each other. Between each of the respectively adjacent surface region portions 204p to be separated from each other a separation region 220 may be provided to compensate a material loss during the separation process. According to various embodiments, the carrier 202 may include one or more separation regions 220 along which the surface region 204f of the carrier 202 are to be separated into a plurality of surface region portions 204p. Illustratively, the surface region portions 204p may be chip or die regions of a wafer, separated from each other via one or scribe line regions.

According to various embodiments, the defect arrangement 206 may have a predefined pattern that defines a plurality of separation lines 111, 113 for separating the surface region of the carrier into the plurality of surface region portions. The crack structure 208 may extend substantially along the separation lines 111, 113. In other words, the crack structure 208 may be formed between the respectively adjacent surface region portions 204p to be separated, i.e. within the one or more separation regions 220. The surface region portions 204p may be also referred to herein as carrier portions 204p.

FIG. 2C shows the surface region 204f of the carrier 202 in a schematic cross-sectional view at a second processing stage, e.g. after process no and process 120 of method 100 are carried out, according to various embodiments. The arrangement of defects 206 may be completely removed. Removing the arrangement of defects 206 may allow providing the surface region portions 204 of the surface region 204f with a sufficient high mechanical stability.

To remove the arrangement of defects 206, the carrier 202 may be partially removed, e.g. the body region 204b of the carrier 202 may be removed partially or completely. According to various embodiments, the arrangement of defects 206 may be removed by thinning the carrier 202 from the backside 202b. The thinning may be performed via grinding, also referred to as polishing, e.g. chemical mechanical polishing. According to various embodiments, the carrier 202 may be reduced in thickness or, in other words, may be partially removed. The thickness of the carrier 202 or in other words, the thickness of the surface region 204f, after process 120 of method 100 is carried out, may be less than about 50 μm.

According to various embodiments, partially removing the carrier may include exposing a second surface 204b of the surface layer 204 opposite the first surface 202f. A remaining part of the carrier 202 may be the surface region 204f. Illustratively, the surface region 204f may be an ultra-thin carrier 202t that is already pre-cracked or cracked into chips or dies. As illustrated in FIG. 2C, the ultra-thin carrier 202t may have a front side surface 202f (that may be the same surfaces as the front side surface 202f of the carrier 202 before the thinning) and an exposed backside surface 204b opposite the front side surface 202f.

The cracks of the crack structure 208 may be very thin, e.g. in the range of about several nanometers, e.g. the cracks may have a width (e.g. an extension into the lateral direction 101 or lateral direction 103 as illustrated in the figures) of less than about 500 nm, e.g. less than about 200 nm, e.g. less than about 100 nm, e.g. less than about 50 nm, e.g. less than about 10 nm. The second surface 204b of the surface layer 204 may be substantially smooth and dense, which allows forming a metallization layer on the second surface 204b of the surface layer 204 without metal of the metallization layer penetrating the cracks of the crack structure 208. Therefore, the sidewalls of the surface region portions 204p (extending from the front side to the backside of the surface region 204f) may remain metal contamination free. In the case that the surface region 204f may include an epitaxial layer, the thinning may be performed so that only the epitaxial layer remains.

FIG. 2D shows a plurality of surface region portions 204p separated from each other in a schematic cross-sectional view at a second processing stage, e.g. after process no, process 120 and process 130 of method 100 are carried out, according to various embodiments. The surface region 204f of the carrier 202 may be separated into a plurality of surface region portions 204p along the crack structure 208. The separation of the surface region portions 204p may include providing a gap 111g between respectively adjacent surface region portions 204p.

FIG. 3A shows a surface region 204f of the carrier 202 in a schematic cross-sectional view at a second processing stage, e.g. before process 130 of method 100 is carried out, according to various embodiments. The surface region 204f illustrated in FIG. 3A may be processed similar as described above, e.g. with reference to FIGS. 2A to 2D. Before separating the surface region 204f into a plurality of surface region portions 204p, a metallization structure 310 may be formed (e.g. in a process 120a which may be included optionally in method 100) on the exposed second surface 204b of the surface region 204f. Illustratively, a backside metallization structure may be formed of the backside of the surface region 204f. Due to the crack formation based on the arrangement of defects 206, electrically conductive material from the metallization structure 310 may not enter the cracks and may not cover the sidewalls of the surface region portions 204p.

According to various embodiments, the metallization structure 310 may include one or more electrically conductive layers (e.g. one or more contacting layers, one or more routing layer, etc.) forming a wiring structure, wherein the wiring structure may be at least partially embedded into dielectric material. According to various embodiments, the metallization structure 310 may be a single metal layer, e.g. copper layer, a copper alloy layer, an aluminum layer, or an aluminum alloy layer. Forming the metallization structure 310 may include, for example, one or more layering processes (e.g. chemical or physical vapor deposition processes) and one or more patterning processes (e.g. including one or more lithographic processes and one or more etch processes, e.g. reactive ion etching).

The surface region 204f and the metallization structure 310 may be separated into a plurality of surface region portions 204f, wherein each of the surface region portions 204f includes a metallization structure portion 310p, as illustrated in FIG. 3B in a schematic cross-sectional view, according to various embodiments. The metallization structure 310 may be configured to break in accordance with the surface region portions 204f into the metallization structure portions 310p during the separation of the surface region portions 204f.

FIG. 4A shows a surface region 204f of the carrier 202 in a schematic cross-sectional view at a second processing stage, e.g. before process 130 of method 100 is carried out, according to various embodiments. The surface region 204f illustrated in FIG. 4A may be processed as described herein, e.g. with reference to FIGS. 2A to 2D, e.g. similar to FIG. 3A.

If the metallization structure 310 may be thick, e.g. having a thickness greater than about 1 μm, the metallization structure 310 may be patterned to support a breaking of the metallization structure 310 into the metallization structure portions 310p during the separation of the surface region portions 204f, as illustrated in FIG. 4B.

The metallization structure 310 may be patterned in accordance with the crack structure 208. Therefore, the metallization structure 310 may be partially removed to expose one or more surface areas 402b of the second surface 204b of the surface region 204f adjacent to the crack structure 208. The patterning process (e.g. a process 120b which may be included optionally in method 100) may include forming a patterned mask layer exposing the regions of the metallization structure 310 to be removed and an etch process, e.g. reactive ion etching, to remove the exposed regions of the metallization structure 310. Illustratively, the crack structure may be exposed on the second surface 204b of the surface region 204f.

The surface region 204f and the metallization structure 310 may be separated into a plurality of surface region portions 204f, wherein each of the surface region portions 204f includes a metallization structure portion 310p, as illustrated in FIG. 4C in a schematic cross-sectional view, according to various embodiments. The metallization structure 310 may be separated into a plurality of metallization structure portions 310p before separating the surface region 204f into a plurality of surface region portions 204f.

FIG. 5 shows the carrier 202 in a schematic cross-sectional view at a first processing stage, e.g. after process 110 of method 100 is carried out, according to various embodiments. According to various embodiments, the arrangement of defects 206, as described above, may be generated via a focused laser beam. This process may be also referred to as stealth dicing.

According to various embodiments, a focus region 502f of the focused laser beam 502b may be scanned within the carrier 202, e.g. within the body region 204b of the carrier 202 and for example not within the surface region 204f of the carrier 202. The focus region 502f of the focused laser beam 502b may be scanned along one or more two-dimensional planes 205h, 505a, 505b (see FIG. 2A). The laser 502 may be operated in pulsed mode so that a plurality of defects 206d (e.g. modification spots) may be generated in the carrier 202 in the desired pattern to provide the arrangement of defects 206 and the crack structure 208.

For generating the arrangement of defects 206 within the carrier 202, i.e. below the surface region 204f, the position of a minimum waist (also referred to as the focus region 502f) of the focused laser beam 502b may be measured, adjusted and guided accordingly. A laser 502 or in other words, a laser arrangement, may be used to generate the focused laser beam 502b. The laser 502 may include optical elements (e.g. at least one lens or at least one mirror) to provide a focus region 502f of the focused laser beam 502b at a desired z position along a z-direction and at a desired position within the x-y-plane. Further, a moveable stage may be used to arrange the carrier 202 relative to the focus region 502f of the focused laser beam 502b and to move the carrier 202 within the x-y-plane (and optionally also in the z-direction) perpendicular to the z-direction. The position of the carrier 202 relative to the position of the focus region 502f of the focused laser beam 502b may be controlled in such a way, that the focused laser beam 502b is provided within the carrier 202 to form the arrangement of defects 206 between the surface region 204f and second surface 202b of the carrier 202.

The focused laser beam 502b may be provided in such a way, that energies may be imposed into the carrier 202 above the damage threshold of the respective carrier material (e.g. silicon). This may cause a localized shell of damaged crystal in the carrier 202, e.g. a localized amorphous region. The locally damaged carrier material may provide the arrangement of defects 206. The locally damaged carrier material (e.g. the arrangement of defects 206) may have a refractive index different from the refractive index of the undamaged carrier material. Therefore, the arrangement of defects 206 may be generated by forming a plurality of defects in a first arrangement level 505a and generating a plurality of defects in a second arrangement level 505b different from the first arrangement level 505a, and the like, wherein a first distance between the first arrangement level 505a and the first surface 202f of the carrier 202 is less than a second distance between the second arrangement level 505b and the first surface 202f of the carrier 202. To avoid distortions due to the different refractive index of the damaged material, the plurality of defects in the second arrangement level 505b is formed after the plurality of defects in first arrangement level 505a is formed.

The position of the carrier 202 relative to the position of the focus region 502f of the focused laser beam 502b may be controlled in such a way, that the focused laser beam 502b is moved within the carrier 202 to provide the arrangement of defects 206 in accordance with a predefined pattern.

As an example, a pulsed and tightly focused laser beam may be used to generate the defects 206d of the arrangement of defects 206, as described herein. The laser pulses may have a duration less than about 1 ns, a power density greater than the damage threshold of the material (e.g. for silicon greater than 1 E10 W/cm$^2$, e.g. in the range from about 1 E10 W/cm$^2$ to about 1E15 W/cm$^2$), a Rayleigh length less than about 10 μm, and a minimal waist less than about 10 μm for a precise location and generation of the defects 206d.

Since surface effects shall be avoided during generating the defects 206, a wavelength may be selected for the focused laser beam 502b in a range where the carrier material is substantially transparent for the laser beam 502b. If the carrier 202 for example substantially consists of silicon, the wavelength may be in the infrared range, e.g. greater than about 800 nm, e.g. in the range from about 800 nm to about 1500 nm, e.g. in the range from about 1000 nm to about 1100 nm.

FIG. 6 shows the carrier 202 in a schematic cross-sectional view at a first processing stage, e.g. after process no of method 100 is carried out, according to various embodiments. The carrier 202 may include a doped layer 604e. The doped layer 604e may be an epitaxial layer, i.e. the doped layer 604e may be epitaxially grown on the underlying surface 604f, e.g. using a chemical vapor deposition process, e.g. plasma enhanced chemical vapor deposition.

Since the doped layer 604e may be less transparent than an undoped layer or in-transparent (illustratively not suitably transparent) for the laser beam 502 having a wavelength in the infrared range, the arrangement of defects 206 may be generated via the laser beam 502b from the backside 202b of the carrier 202, as illustrated for example in FIG. 5.

The doped layer 604e may be the surface region 204f of the carrier 202 or may be part of the surface region 204f of the carrier 202. According to various embodiments, the surface region 204f or the doped layer 604e of the surface region 204f may be readily processed, e.g. including one or more electronic structure elements. According to various embodiments, the carrier 202 may also include a front side metallization disposed on and/or over the first surface 202f of the carrier 202.

FIG. 7A shows the carrier 202 in a schematic cross-sectional view at a first processing stage, e.g. during or after process no of method 100 is carried out, according to various embodiments. The carrier 202 may be adhered to an auxiliary carrier 702, e.g. to a glass carrier or any other suitable auxiliary carrier. The surface region 204f of the carrier 202 may face the auxiliary carrier 702. In this case, the backside 202b of the carrier 202 is exposed for processing the backside 202b. The carrier 202 may be mounted at the auxiliary carrier 702 also during other processes of the method 100, e.g. during process 120 or during forming the backside metallization structure 310 as illustrated in FIG. 7B in a schematic cross-sectional view. Via the auxiliary carrier 702, a thinning of the carrier 202 from the backside may be carried out, as described above, e.g. for removing the arrangement of defects 206.

Forming the arrangement of defects 206 via a focused layer beam may be more efficient in the case that the carrier 202 has a thickness of less than about 300 μm. Therefore, according to various embodiments, the carrier 202 may be thinned to a thickness of less than about 300 μm, e.g. to a thickness in the range from about 70 μm to about 300 μm, before the arrangement of defects 206 is formed in the carrier 202. This may be achieved by thinning the carrier 202 from the backside 202b via grinding or any other suitable process.

Figure 7C:
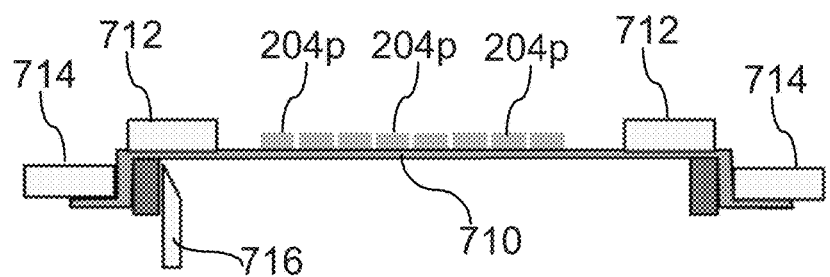
FIG. 7C shows a surface region of a carrier in a schematic cross-sectional during processing the carrier, according to various embodiments.

FIG. 7C shows the surface region 204f of the carrier 202 in a schematic cross-sectional view during a separation process, according to various embodiments. Separating the surface region 204f of the carrier 202 may include mounting (e.g. taping) the surface region on an expansion tape 710; and expanding the expansion tape 710 to laterally separate the plurality of surface region portions 204p from each other along the crack structure 208.

The expansion tape 710 may be mounted at an outer frame 714, expanded and mounted at an inner frame 712. After the expansion tape 710 is expanded, a tape cutter 716 may be used to cut the expansion tape 710. The expansion tape 710 may be also referred to as dicing tape. However, any other suitable process for separating the surface region portions 204p from each other may be used. As an example, the expansion tap 710 may be radially stretched and, subsequently, clamped between two outer frames.

As an example, a surface region portion 204p (e.g. each single ultra-thin chip) of a plurality of surface region portions 204p (e.g. of the plurality of ultra-thin chips) may be removed separately from the pre-processed surface region 204f (e.g. from the ultra-thin carrier or wafer) via a so-called Pick, Crack & Place™ process.

According to various embodiments, after separating the surface region portions 204p from each other, the separated surface region portions 204p may further processed, e.g. a packing process may be carried out. Further, according to various embodiments, the surface region portions 204p may be at least partially covered with an encapsulation material before they are separated from each other, e.g. illustratively on wafer-level.

Figure 8:
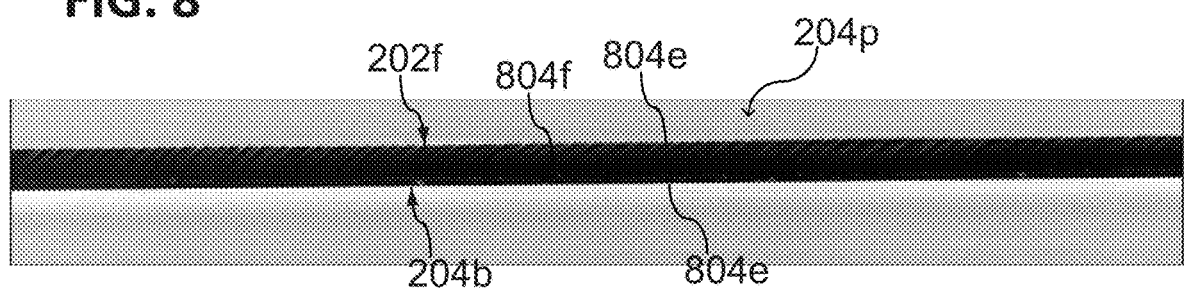
FIG. 8 shows a scanning electron microscopy image of a carrier portion separated from the carrier, according to various embodiments.

FIG. 8 shows a scanning electron microscopy image of a 15 μm thick die (i.e. surface region portion) 204p after separation, e.g. after process 130 of method 100 is carried out. Using the separation process described herein, smooth edges 804e may be generated at the fractured surface 704f (e.g. the sidewalls) of the surface region portion 204p, according to various embodiments. Further, the fractured surface 704f may be free of electrically conductive material, e.g. a metal, whereas the metallization structure 310 may be formed over the backside 204b of the surface region 204f.

The arrangement of defects 206 may be configured to provide a pre-defined breaking structure 208 so that the surface region 204f breaks into pieces 204p, wherein the pieces 204p have smooth edges and a smooth fractured surface (the sidewalls of the pieces 204p) respectively, as illustrated in FIG. 8.

According to various embodiments, the surface region 204f or, in other words, the ultra-thin wafer 202t, may be diced by forming the arrangement of defects 206 in the carrier 202 before thinning the carrier 202 and, subsequently, thinning the carrier 202 to a target thickness below 50 μm, so that the ultra-thin wafer 202t is provided. The arrangement of defects 206 may cause mechanical stress and/or strain in the carrier 202 so that the crack structure is formed through the surface region 204f.

According to various embodiments, the carrier 202 may be processed as follows: mounting the carrier 202 with its front side to a glass carrier, grinding the carrier 202 to a first thickness, e.g. in the range from about 70 μm to about 300 μm, subsequently, forming the defects 206 via stealth dicing, e.g. using two or more scans, and grinding the carrier 202 to a target thickness, e.g. less than about 50 μm.

According to various embodiments, in the case that the carrier 202 includes an epitaxial layer as the surface region 204f, the target thickness may be equal to the thickness of the epitaxial layer.

According to various embodiments, grinding the carrier 202 to the target thickness may remove the stealth dicing damage completely.

According to various embodiments, the stealth laser separation may be carried out from the backside 202b of the carrier 202 to cause separation cracks through the carrier 202 including the surface region 204f. The surface region 204f may include or may be a highly doped epitaxial layer. The highly doped epitaxial layer may not allow a penetration of the laser beam from the front side of the carrier 202 due to infrared light absorption.

The separated dies (i.e. the surface region portions 204p) may be formed on the glass carrier, wherein the sidewalls may be not damaged even for a die thicknesses less than about 50 μm. The carrier 202 may be mounted to the auxiliary carrier 702 (e.g. to a glass carrier) via a glue or a mounting tape.

According to various embodiments, the thinned carrier 202t or the surface region 204f that is mounted on the auxiliary carrier 702 may be subjected to a backside processing after the carrier 202 is thinned to the target thickness. Therefore, a flat surface 204b is provided for the backside processing. The backside processing may include metal deposition and a lithographic process for patterning the deposited metal, and the like. The separation gap (e.g. the cracks of the crack structure 208) 111g between the dies 204p may be very small (e.g. in the nanometer range) so that the backside processing (e.g. wet etching, plasma etching, lithography, sputter deposition, etc.) processes may be not affected (or negligible effected) by the small cracks.

For separating the dies 204p from each other, as illustrated in FIG. 8, the thinned carried 202t (or in other words the surface region 204f) may be mounted on an expansion tape 710 (e.g. the tape may be laminated on the backside metallization 310, 310*p* of the thinned carried 202*t*). The expansion tape 710 may be fixed at the outer frame 714. The auxiliary carrier 702 (e.g. the glass carrier) may be demounted from the front side (e.g. via ashing the glue through the glass carrier via a laser beam). In an expansion process, a distance between the dies 204*p* is generated and the inner frame 712 may be fixed to the expansion tape 710. Afterwards, the expansion tape 710 may be cured via ultra-violet light and the expansion tape 710 with the attached dies 204*p* may be ready for shipment and pick up.

According to various embodiments, the dies 204*p* formed with the process flow described herein may have a high breaking strength due to removal of laser damage 206. The process flow described herein may be compatible to backside metal deposition and backside metal patterning. The process flow described herein may provide a topologic step free backside patterning process. The process flow described herein may easily prevent metal deposition on the die sidewalls during backside processing. The process flow described herein may cause no propagation of edge cracks into the wafer (or in other words into the carrier). The process flow described herein may provide ultra-thin scribe-lines, for example with a width of less than about 20 μm.

According to various embodiments, the dies 204*p* may include any suitable structure for a desired application. The dies 204*p* may be configured as ultra-thin Mosfets, e.g. with a copper backside metal. The dies 204*p* may be configured as RF-ID device for RF-ID applications, tagging, etc. The identification chips may be laminated into documents, papers, notes, etc. (for example without backside metallization). The dies 204*p* may be configured as ultra-thin IGBTs, e.g. with a copper backside metal.

According to various embodiments, in the case that the surface region 204*f* of the carrier 202 is not highly doped or in other words is sufficiently transparent to infrared light, a similar process flow may be realized by stealth dicing from the front side (e.g. down to 150 μm) before mounting the carrier 202 on an auxiliary carrier 702. In this case, only one grinding process may be used for removing the laser damage.

In the following, various examples are provided with reference to the figures described above.

Example 1 is a method 100 for processing a carrier 202, the method including: forming an arrangement of defects 206 in the carrier 202, wherein a surface region 204*f* of the carrier 202 is disposed over the arrangement of defects 206 at a first surface 202*f* of the carrier 202, wherein the arrangement of defects 206 is configured to generate a crack structure 208 extending from the arrangement of defects 206 into the surface region 204*f*; partially removing the carrier 202 to remove the arrangement of defects 206; and (e.g. subsequently) separating the surface region 204*f* of the carrier 202 into a plurality of surface region portions 204*p* along the crack structure 208. The surface region 204*f* of the carrier 202 (after partially removing the carrier 202 to remove the arrangement of defects 206) may be regarded as a thin or ultra-thin carrier 202*t*, e.g. having a thickness less than the carrier 202 before the arrangement of defects 206 is removed, e.g. less than about 50 μm. The thin or ultra-thin carrier 202*t* includes the plurality of surface region portions 204*p*, wherein the cracks of the crack structure 208 are disposed between respectively adjacent surface region portions 204*p*. In the case that the carrier 202 is a wafer, the surface region 204*f* of the carrier 202 (after partially removing the carrier 202 to remove the arrangement of defects 206) may be regarded as a thin or ultra-thin wafer 202*t*, e.g. having a thickness less than the carrier 202 before the arrangement of defects 206 is removed, e.g. less than about 50 μm. In this case, the surface region portions 204*p* may be usually referred to as chips or dies. Illustratively, method 100 may be separation process (also referred to as singulation or dicing process) for separating the surface region portions 204*p* from each other (or in other words, singulating the surface region portions 204*p* or for dicing the surface region 204*f* into the surface region portions 204*p*).

In Example 2, the method of Example 1 may optionally include that the carrier 202 includes or consists of semiconductor material.

In Example 3, the method of Example 1 or 2 may optionally include that the surface region 204*l* includes or consists of semiconductor material.

In Example 4, the method of Example 3 may optionally include that the surface region 204*l* includes or consists of an epitaxial layer of semiconductor material.

In Example 5, the method of Example 3 or 4 may optionally include that semiconductor material of the surface region 204*f* is doped with a dopant concentration greater than $10^{16}$ cm$^{-3}$ (dopant atoms per cubic centimeter).

In Example 6, the method of any one of Examples 2 to 5 may optionally include that the semiconductor material includes or consists of silicon.

In Example 7, the method of any one of Examples 1 to 6 may optionally include that forming an arrangement of defects 206 includes generating a plurality of defects 206*d* in the carrier 202 via a focused laser beam 502*b*. The plurality of defects 206*d* may be generating via stealth dicing.

In Example 8, the method of any one of Examples 1 to 7 may optionally include that forming an arrangement of defects 206 includes generating a plurality of defects 206*d* in a first arrangement level 505*a* and generating a plurality of defects in a second arrangement level 505*b* different from the first arrangement level 505*a*. The plurality of defects 206*d* may be generating via stealth dicing.

In Example 9, the method of Example 8 may optionally include that a first distance between the first arrangement level 505*a* and the first surface 202*f* of the carrier 202 is less than a second distance between the second arrangement level 505*b* and the first surface 202*f* of the carrier 202, and that the plurality of defects 206*d* in the second arrangement level 505*b* is formed after the plurality of defects 206*d* in first arrangement level 505*a* is formed.

In Example 10, the method of any one of Examples 1 to 9 may optionally include that each defect 206*d* of the arrangement of defects 206 includes amorphized material (e.g. amorphous silicon) of the carrier 202 surrounded by crystalline material (e.g. crystalline silicon) of the carrier 202. According to various embodiments, the carrier 202 may be a single crystalline carrier so that the arrangement of defects 206 includes amorphized material (e.g. amorphous silicon) of the carrier 202 surrounded by single crystalline material (e.g. single crystalline silicon) of the carrier 202.

In Example 11, the method of any one of Examples 1 to 10 may optionally include that the arrangement of defects 206 has a predefined pattern defining a plurality of separation lines 111, 113 for separating the surface region 204*f* of the carrier 202 into the plurality of surface region portions 204*p*. The separation lines 111, 113 may be also referred to as scribe-lines.

In Example 12, the method of any one of Examples 1 to 11 may optionally include that partially removing the carrier 202 includes exposing a second surface 204*b* of the surface region 204*f* opposite the first surface 202*f*.

In Example 13, the method of Example 12 may optionally further include (e.g. before separating the surface region 204f into a plurality of surface region portions 204p) forming a metallization structure 310, 310p on the exposed second surface 204b of the surface region 204f.

In Example 14, the method of Example 13 may optionally include that forming a metallization structure 310, 310p includes forming at least one metallization layer 310 and patterning the at least one metallization layer 310p in accordance with the crack structure 208.

In Example 15, the method of Example 14 may optionally include that patterning the metallization layer 310p in accordance with the crack structure 208 includes partially removing the metallization layer 310 to expose one or more surface area 402b of the second surface 204b of the surface region 204f adjacent to the crack structure 208.

In Example 16, the method of any one of Examples 1 to 15 may optionally further include adhering the carrier 202 to an auxiliary carrier 702, wherein the surface region 204f of the carrier 202 faces the auxiliary carrier 702 and wherein a backside 202b of the carrier 202 is exposed.

In Example 17, the method of Example 16 may optionally include that partially removing the carrier 202 includes thinning the carrier 202 from the backside 202b.

In Example 18, the method of Example 17 may optionally include that thinning the carrier 202 includes grinding the carrier 202. Grinding the carrier 202 may be performed via polishing, e.g. chemical mechanical polishing or any other suitable grinding process. The carrier 202 may be thinned from the backside 202b of the carrier 202. According to various embodiments, the front side 202f of the carrier 202 and/or the surface region 204f may be readily processed, e.g. including one or more electronic structures.

In Example 19, the method of Example 17 or 18 may optionally include that thinning the carrier 202 includes reducing a thickness of the carrier 202 to less than 50 μm.

In Example 20, the method of any one of Examples 1 to 19 may optionally further include, before forming an arrangement of defects 206 in the carrier 202, thinning the carrier to a thickness of less than 300 μm.

In Example 21, the method of any one of Examples 1 to 20 may optionally include that separating the surface region 204f of the carrier includes attaching the surface region 204f to an expansion tape 710 and expanding the expansion tape 710 to laterally separate the plurality of surface region portions 204p from each other.

Example 22 is a method 100 for processing a carrier 202, the method including: forming an arrangement of defects 206 in a support region 204b of the carrier 202, wherein the arrangement of defects 206 is configured to generate a crack structure 208 extending into a surface region 204f of the carrier 202 disposed at a front side 202f of the carrier 202 over the support region 204b, the crack structure 208 defining a plurality of separation lines 111, 113 for separating the surface region 204f of the carrier 202 into a plurality of surface region portions 204p; thinning the carrier 202 from a backside 202b of the carrier 202 opposite the front side 202f to remove the arrangement of defects 206; and separating the plurality of surface region portions 204p of the surface region 204f from each other along the separation lines 111, 113.

Example 23 is a carrier 202, including: a support region 204b and a surface region 204f disposed over the support region 204b, wherein the surface region 204f provides an upper surface 202f of the carrier 202; an arrangement of defects 206 disposed in the support region 204b of the carrier 202, and a crack structure 208 extending from the arrangement of defects 206 into the surface region 204f.

In Example 24, the carrier 202 of Example 23 may optionally include that the surface region 204f has a thickness of less than 50 μm.

In Example 25, the carrier 202 of Example 23 or 24 may optionally include that the surface region 204f includes doped semiconductor material. The semiconductor material may include or may be silicon.

In Example 26, the carrier 202 of any one of Examples 23 to 25 may optionally include that the arrangement of defects 206 includes a plurality of defects 206d arranged in a first arrangement level 505a and in a second arrangement level 505b different from the first arrangement level 505a.

In Example 27, the carrier 202 of Example 26 may optionally include that a first distance between the first arrangement level 505a and the surface 202f of the carrier 202 is less than a second distance between the second arrangement level 505b and the surface 202f of the carrier 202.

In Example 28, the carrier 202 of Example 26 or 27 may optionally include that the defects 206d of the arrangement of defects 206 are arranged in a predefined pattern defining a plurality of separation lines 111, 113 for separating the surface region 204f of the carrier 202 into the plurality of surface region portions 204p.

In Example 29, the carrier 202 of any one of Examples 23 to 28 may optionally include that each defect 206d of the arrangement of defects 206 includes amorphous material of the body region 204b of the carrier 202 surrounded by single crystalline material of body region 204b of the carrier 202.

Example 30 is a carrier arrangement, including an auxiliary carrier 702 and a carrier 202 of any one of Examples 23 to 29 mounted on the auxiliary carrier 702.

Example 31 is a method 100 for processing a carrier 202, the method including: forming an arrangement of defects 206 in a support layer 204b of the carrier 202, wherein a surface layer 204f of the carrier 202 is disposed over the support layer 204b, wherein the arrangement of defects 206 is configured to generate a crack structure 208 extending from the support layer 204b into the surface layer 204f of the carrier 202; removing the support layer 204b to remove the arrangement of defects 206 and to expose the surface layer 204f; and separating the surface layer 204f of the carrier 202 into a plurality of surface layer portions 204p along the crack structure 208.

Example 32 is a method 100 for processing a carrier 202, the method including: forming an arrangement of defects 206 in a support region 204b of the carrier 202, wherein a surface region 204f of the carrier 202 is disposed over the support region 204b, wherein the arrangement of defects 206 is configured to generate a crack structure 208 extending from the support region 204b into the surface region 204a of the carrier 202; removing the support region 204b to remove the arrangement of defects 206; and separating the surface region 204f of the carrier 202 into a plurality of surface region portions 204p along the crack structure 208.

Example 33 is a carrier 202t, including: a crack structure 208 extending from a front side 202f of the carrier 202t through the carrier 202t to a backside 204b of the carrier 202t, the crack structure 208 separating a plurality of portions 204p of the carrier 202t from each other; wherein the carrier 202t has a thickness of less than 50 μm and includes a metallization structure 310, 310p disposed at the backside 204b of the carrier 202t.

Example 34 is a carrier arrangement, including: an expansion tape 710; a carrier 202t disposed on the expansion tape 710, the carrier 202t having a thickness of less than 50 μm, wherein the carrier 202t includes a crack structure 208 extending from a front side 202f of the carrier 202t through the carrier 202t to a backside 204b of the carrier 202t, the crack structure 208 separating a plurality of carrier portions 204p of the carrier 202t from each other; wherein the carrier 202t includes a metallization structure 310, 310p disposed at the backside 204b of the carrier 202t.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A method for processing a carrier, the method comprising:
   generating a crack structure by forming an arrangement of defects in the carrier, wherein a surface region of the carrier is disposed over the arrangement of defects at a first surface of the carrier, wherein the crack structure extends from the arrangement of defects into the surface region, and wherein the carrier comprises a semiconductor wafer;
   after generating the crack structure, partially removing the carrier and thereby removing the arrangement of defects exposing a second surface of the surface region opposite the first surface;
   after partially removing the carrier, forming a metallization structure on the exposed second surface of the surface region; and
   separating the surface region of the carrier into a plurality of surface region portions along the crack structure.

2. The method of claim 1, wherein the surface region comprises semiconductor material.

3. The method of claim 2, wherein the semiconductor material is doped with a dopant concentration greater than $10^{16}$ cm-3.

4. The method of claim 1, wherein forming the arrangement of defects comprises generating a plurality of defects in the carrier via a focused laser beam.

5. The method of claim 1, wherein forming the arrangement of defects comprises generating a plurality of defects in a first arrangement level and generating a plurality of defects in a second arrangement level different from the first arrangement level.

6. The method of claim 5, wherein a first distance between the first arrangement level and the first surface of the carrier is less than a second distance between the second arrangement level and the first surface of the carrier, wherein the plurality of defects in the second arrangement level is formed after the plurality of defects in the first arrangement level is formed.

7. The method of claim 1, wherein each defect of the arrangement of defects comprises amorphized material of the carrier surrounded by crystalline material of the carrier.

8. The method of claim 1, wherein forming the metallization structure comprises forming at least one metallization layer and patterning the at least one metallization layer in accordance with the crack structure.

9. The method of claim 1, further comprising adhering the carrier to an auxiliary carrier, wherein the surface region of the carrier faces the auxiliary carrier, and wherein a backside of the carrier is exposed.

10. The method of claim 9, wherein partially removing the carrier comprises thinning the carrier from the backside of the carrier.

11. The method of claim 10, wherein thinning the carrier comprises reducing a thickness of the carrier to less than 50 μm.

12. The method of claim 1, further comprising: before forming the arrangement of defects in the carrier, thinning the carrier to a thickness of less than 300 μm.

13. The method of claim 1, wherein separating the surface region of the carrier comprises attaching the surface region to an expansion tape, and expanding the expansion tape to separate the plurality of surface region portions from each other.

* * * * *